United States Patent [19]

Koch et al.

[11] Patent Number: 4,762,892
[45] Date of Patent: Aug. 9, 1988

[54] POLYMERS MODIFIED BY A POLYMER-ANALOGOUS REACTION

[75] Inventors: Horst Koch, Grosskarlbach; Walter Ziegler, Edingen-Neckarhausen, both of Fed. Rep. of Germany

[73] Assignee: BASF Aktiengesellschaft, Fed. Rep. of Germany

[21] Appl. No.: 7,471

[22] Filed: Jan. 28, 1987

[30] Foreign Application Priority Data

Jan. 28, 1986 [DE] Fed. Rep. of Germany ....... 3602472

[51] Int. Cl.$^4$ .......................... C08F 8/00; C08F 8/44; C08F 210/02; C08F 220/06
[52] U.S. Cl. ................................... 525/279; 525/282; 525/284; 525/286; 525/291; 525/910; 525/911
[58] Field of Search ................ 525/911, 286, 291, 279

[56] References Cited

U.S. PATENT DOCUMENTS

| 3,448,089 | 6/1969 | Celeste | 525/286 |
| 3,746,673 | 7/1973 | Simms et al. | 525/286 |
| 3,786,116 | 1/1974 | Milkovich et al. | 525/286 |
| 4,537,667 | 8/1985 | Bishop et al. | 525/286 |
| 4,540,742 | 9/1985 | Okamoto et al. | 525/286 |
| 4,656,217 | 4/1987 | Sugiura et al. | 525/279 |
| 4,659,781 | 4/1987 | Okude et al. | 525/279 |

Primary Examiner—Carman J. Seccuro
Attorney, Agent, or Firm—Keil & Weinkauf

[57] ABSTRACT

Polymers which have been modified by a polymer-analogous reaction, in the acid form or in the form of their salts, consist of a copolymer of ethylene, (meth)acrylic acid and one or more compounds selected from the group consisting of vinyl esters, vinyl ethers, (meth)acrylates and (meth)acrylamides, and olefinically unsaturated side radicals which have been introduced into the said copolymer by a polymer-analogous reaction and are of the general formula I

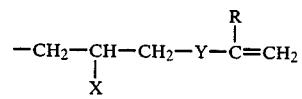

where X is hydroxyl, amino or mercapto, Y is an ester, amide, ether or $C_1$–$C_{10}$-alkylene group and R is hydrogen or methyl.

22 Claims, No Drawings

POLYMERS MODIFIED BY A POLYMER-ANALOGOUS REACTION

The present invention relates to polymers which have been modified by a polymer-analogous reaction, are in the acid form or in the form of their salts and consist of
(A) a copolymer of
  ($a_1$) from 30 to 70 parts by weight of ethylene,
  ($a_2$) from 5 to 40 parts by weight of acrylic acid or methacrylic acid or of a mixture of these and
  ($a_3$) from 5 to 50 parts by weight of one or more compounds selected from the group consisting of vinyl esters, vinyl ethers, acrylates, methacrylates, acrylamides and/or methacrylamides, and
(B) side radicals which are introduced into the said copolymer by a polymer-analogous reaction and are of the general formula I

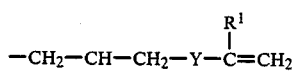
I where X is hydroxyl, amino or mercapto, Y is an ester, amide, ether or $C_1$-$C_{10}$-alkylene group and $R^1$ is hydrogen or methyl, and
(C) if required, further side radicals which are introduced by a polymer-analogous reaction and are of the general formula II

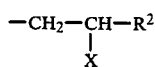
II where $R^2$ is a polar group, hydrogen or another group X.

The present invention furthermore relates to the use of such polymers, which have been modified by a polymer-analogous reaction, for the preparation of materials which can be crosslinked by photopolymerization, and of printing plates, relief plates and photoresists, as well as photocrosslinked printing forms, relief forms and photoresists produced by using such polymers.

Similar polymers modified by a polymer-analogous reaction are disclosed in JP-A-No. 76/144 445 and JP-A-No. 75/073 944. The patent applications describe reaction products of liquid butadiene rubbers having molecular weights of from 500 to 3000 with (a) maleic anhydride in the first stage and (b) acrylates in the second stage, the said acrylates containing hydroxyl or glycidyl groups in their alkyl radicals. Accordingly, they are butadiene rubbers which possess photopolymerizable side groups B and carboxyl side groups and are used for the production of printing plates and printing forms. However, polymers of this type have disadvantageous performance characteristics. Because of their low molecular weights, they are liquid or pasty and are therefore difficult to handle. Photo crosslinkable materials and printing plates based on these polymers are not dimensionally stable and can scarcely be stored. Photocrosslinkable materials, printing forms, relief forms and photoresists produced using such polymers are tacky and thermally unstable and have a low tensile strength.

It is an object of the present invention to replace the known polymers modified by a polymer-analogous reaction by novel, solid, elastomeric polymers which are modified by a polymer-analogous reaction, are soluble in conventional solvents and furthermore permit the production of dimensionally stable materials, printing plates, relief plates and photoresists which have a long shelf life and can be crosslinked by photopolymerization, and of thermally stable and non-tacky photocrosslinked materials, printing forms, relief forms and photoresists which have a high tensile strength.

We have found that this object is achieved by the polymers modified by a polymer-analogous reaction, which are defined at the outset and will be referred to below as polymers according to the invention.

The polymers according to the invention are solid and elastomeric and are distinguished by their excellent solubility in conventional solvents, in particular in water. After the addition of suitable additives, they can be crosslinked by photopolymerization. In this respect, they exhibit good compatibility with a large number of additives. The materials, printing plates, relief plates and photoresists which can be crosslinked by photopolymerization and are based on the polymers according to the invention are elastomeric and dimensionally stable and have a long shelf life. Photocrosslinked printing forms, relief forms, photoresists and materials based on the said polymers are thermally stable and nontacky and have a high tensile strength.

For the purposes of the present invention, substances are referred to as compatible when they are capable of remaining dispersed in one another. The term materials denotes materials of any external shape, for example adhesive materials, sealing materials or films which do not contain imagewise information, whereas the term forms is understood as meaning materials which are distinguished by an imagewise information content, for example printing forms, relief forms and photoresists.

Copolymers A of
  ($a_1$) ethylene,
  ($a_2$) (meth)acrylic acid and
  ($a_3$) one or more vinyl esters, vinyl ethers, (meth)acrylates and/or (meth)acrylamide are known per se.

They can be prepared, for example, by the LDPE (low density polyethylene) high pressure polymerization method, at from 200° to 400° C. and under a pressure of more than 800 kg/cm² (see, for example, German Patent No. 2,341,462, U.S. Pat. No. 3,264,272 and German Patent Application P No. 35 39 469.2.

Vinyl esters which are particularly suitable as comonomers $a_3$ are those of the general formula III

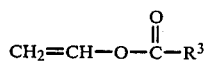
III where $R_3$ is an alkyl or cycloalkyl radical of 1 to 10 carbon atoms, e.g. vinyl acetate, vinyl propionate, vinyl butyrate, vinyl valerate or vinyl hexanecarboxylate. Vinyl acetate is preferred.

Vinyl ethers which are particularly suitable as comonomers $a_3$ are those of the general formula IV

IV e.g. vinyl ethyl ether, vinyl prop-1-yl ether, vinyl prop-2-yl ether, vinyl but-1-yl ether, vinyl but-2-yl ether or vinyl pent-1-yl ether. Vinyl but-1-yl ether is preferred.

(Meth)acrylates and (meth)acrylamides which are particularly suitable as comonomers $a_3$ are those of the general formula V

where $R^1$ has the meanings stated for formula I, $R^4$ is an alkyl or cycloalkyl radical of 1 to 10 carbon atoms or ω-methylpoly-(alkylene oxide)-α-oxyl and Z is oxygen or an $NR^5$ group, where $R^5$ is H or $C_1$-$C_4$-alkyl. Examples of suitable (meth)acrylates and/or (meth)acrylamides are methyl acrylate, methyl methacrylate, ethyl acrylate, ethyl methacrylate, propyl acrylate, propyl methacrylate, n-butyl acrylate, n-butyl methacrylate, n-pentyl acrylate, n-pentyl methacrylate, n-hexyl acrylate, n-hexyl methacrylate, tert-butyl acrylate, cyclohexyl acrylate, cyclohexyl methacrylate, 2-ethylhexyl acrylate, 2-ethylhexyl methacrylate, dicyclopentadienyl acrylate, ω-methylpoly(ethylene oxide)-α-yl (meth)acrylate, ω-methylpoly-(propylene 1,2-oxide)-α-yl (meth)acrylate, ω-methylpoly(propylene 1,3-oxide)-α-yl (meth)acrylate, etc., and N-ethylacrylamide, N-methyl-N-butylmethacrylamide, N-ethyl-N-(2-ethylhexyl)-acrylamide, etc. N-Butyl acrylate, 2-ethylhexyl acrylate, ω-methylpoly-(ethylene oxide)-α-yl acrylate and dicyclopentadienyl acrylate are preferred, the first three of these being particularly preferred.

Preferred copolymers A are ethylene/(meth)acrylic acid copolymers which contain n-butyl acrylate, 2-ethylhexyl acrylate and/or ω-methylpoly-(ethylene oxide)-α-yl acrylate as polymerized comonomers $a_3$. Advantageous copolymers A have a Shore A hardness of more than 10, in particular from 15 to 75.

Examples of suitable olefinically unsaturated side radicals B are 2-hydroxy-5-oxo-4-oxahept-6-en-1-yl, 2-amino-5-oxo-4-oxahept-6-en-1-yl, 2-mercapto-5-oxo-4-oxahept-6-en-1-yl, 2-hydroxy-5-oxo-4-oxa-6-methylhept-6-en-1-yl, 2-amino-5-oxo-4-oxa-6-methylhept-6-en-1-yl, 2-mercapto-5-oxo-4-oxa-6-methylhept-6-en-1-yl, 2-hydroxy-5-oxo-4-azahept-6-en-1-yl, 2-amino-5-oxo-4-azahept-6-en-1-yl, 2-mercapto-5-oxo-5-azahept-6-en-1-yl, 2-hydroxy-5-oxo-4-aza-6-methylhept-6-en-1-yl, 2-amino-5-oxo-4-aza-6-methylhept-6-en-1-yl, 2-mercapto-5-oxo-4-aza-6-methylhept-6-en-1-yl, 2-hydroxy-4-oxahex-5-en-1-yl, 2-amino-4-oxahex-5-en-1-yl, 2-mercapto-4-oxahex-5-en-1-yl, 2-hydroxyhex-5-en-1-yl, 2-aminohex-5-en-1-yl, 2-mercaptohex-5-en-1-yl, 2-hydroxyhept-6-en-1-yl, 2-aminohept-6-en-1-yl and 2-mercapto-hept-6-en-1-yl. The 2-hydroxy-5-oxo-4-oxa-6-methylhept-6-en-1-yl radical VI

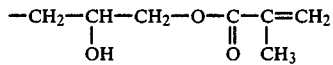

is preferred.

In addition to the above radicals B, the polymers according to the invention may additionally contain side radicals C which possess polar groups capable of dipole-dipole, dipole-ion or ion-ion interactions. Examples of suitable radicals C are 2-hydroxyeth-1-yl, 2-aminoeth-1-yl, 2-mercaptoeth-1-yl, 2,3-dihydroxyprop-1-yl, 2-amino-3-hydroxy-prop-1-yl, 2-mercapto-3-hydroxyprop-1-yl and ω-alkylpoly-(ethylene oxide)-α-oxyl.

In a preferred procedure, the olefinically unsaturated side radicals B and, where relevant, the radicals C are introduced into the copolymers A, i.e. the polymers according to the invention are synthesized, by reacting some or all of the carboxyl groups in the copolymers A with suitable oxiran-2-yl, thiiran-2-yl and aziridin-2-yl compounds, the amounts being chosen so that one or more carboxyl groups are converted. If it is desired to introduce radicals C in addition to the olefinically unsaturated radicals B, only some of the carboxyl groups are converted in order to introduce the radicals B, so that one or more carboxyl groups per molecular chain are still available for introduction of the radical C. In order that free carboxyl groups are still available in the end products for any desired salt formation, it is advantageous if overall only some of the carboxyl groups are allowed to react during the introduction of the radicals B and, where relevant, C.

The reaction of carboxyl-containing compounds with oxiran-2-yl, thiiran-2-yl or aziridin-2-yl compounds with ring opening and formation of an α-hydroxy, α-mercapto or α-amino ester is known per se and is described in, for example, the company publication Reactive Monomers, Nissan Blemmer G, High Polymer Modifiers (Nippon Oil and Fats Co. Ltd.) from 1968. It is also known that glycidyl compounds can be used instead of oxiran-2-yl compounds. In a preferred procedure, the copolymers A are reacted with these compounds in solvents such as tetrahydrofuran, toluene, ethylbenzene, methyl ethyl ketone, methyl isobutyl ketone or a mixture of these. If necessary, p-dimethylaminopyridine or N-methylimidazole is added as a catalyst to the solutions of the copolymers A, and, for example, 2,6-di-tert-butyl-p-cresol or N-nitrosodiphenylamine is added to the said solutions as an inhibitor. The desired amount of oxiran-2-yl or glycidyl, thiiran-2-yl or aziridin-2-yl compound is added dropwise to these solutions at a rate such that the temperature of the reaction mixture is from 40° to 110° C. If necessary, the temperature is adjusted by heating or cooling. After the dropwise addition, the reaction mixture is advantageously stirred for a further 3–10 hours at 50° C., and the solvent is removed in a suitable manner, for example by distillation under reduced pressure. In another advantageous procedure, the copolymer A is reacted with the above compounds in a kneader, for example at from 125° to 180° C. for from 3 to 60 minutes, or the reaction is carried out in a twin-screw extruder, advantageously with a residence time of from 5 to 10 minutes.

Suitable compounds for the reaction, stated below, for introducing the radicals B are, for example, oxirane-2-methylol acrylate, oxirane-2-methylol methacrylate, glycidyl acrylate, glycidyl methacrylate, aziridine-2-methylol acrylate, aziridine-2-methylol methacrylate, thiirane-2-methylol acrylate or thiirane-2-methylol methacrylate; N-(2-oxiranyl)-methylacrylamide, N-(2-oxiranyl)-methylmethacrylamide, N-(2,3-dihydroxyprop-1-yl)-acrylamide, N-(2,3-dihydroxyprop-1-yl)-methacrylamide, N-(2-aziridinyl)methylacrylamide, N-(2-aziridinyl)-methylmethacrylamide, N-(2-thiiranyl)-methylacrylamide or N-(2-thiiranyl)-methylmethacrylamide; 1-(oxiran-2-yl)-2-oxabut-3-ene, glycidyl monovinyl ether, 1-(aziridin-2-yl)-2-oxabut-3-ene or 1-(thiiran-2-yl)-2-oxabut-3-ene; 4-(oxiran-2-yl)-but-1-ene, 5,6-dihydroxyhex-1-ene, 5-(oxiran-2-yl)-pent-1-ene, 6,7-dihydroxypent-1-ene, 4-(aziridin-2-yl)-but-1-ene, 5-(aziridin-2-yl)-pent-1-ene, 4-(thiiran-2-yl)-but-1-ene or 5-(thiiran-2-yl)-pent-1-ene. Glycidyl methacrylate and oxirane-2-methylol methacrylate are preferred. They are used in amounts of from 1 to 30, preferably from 2 to 20, in particular from 3 to 15, % by weight, based on the polymer.

Examples of suitable compounds for the reaction for the optional introduction of radicals C are oxirane, aziridine, thiirane, 2-methyloloxirane, 2-methylolaziridine, 2-methylolthiirane and 2-[ω-methylpoly-(ethylene oxide)]-oxirane, as well as compounds which contain glycidyl, oxiranyl, aziridinyl or thiiranyl radicals and highly polar groups.

The polymers according to the invention are advantageously used for the production of materials, printing plates, relief plates and photoresists which can be crosslinked by photopolymerization. For this purpose, effective amounts of suitable photoinitiators and, if required, suitable photopolymerizable monomers, salt formers, plasticizers, thermal polymerization inhibitors, dyes and pigments, agents for improving the relief structure, crosslinking agents, antioxidants, fillers, fluxes or mold release agents are added to the said polymers. Mixtures of the polymers according to the invention and the suitable additives are referred to below as mixtures for the sake of brevity.

Examples of suitable photoinitiators are benzoin or benzoin derivatives, such as its methyl, isopropyl, n-butyl or isobutyl ether, symmetrically or asymmetrically substituted benzil acetals, such as benzil dimethyl acetal or benzil 1-methyl 1-ethyl acetal, acyldiarylphosphine oxides according to German Laid-Open Application DOS No. 2,909,992, and substituted and unsubstituted quinones, such as ethyl anthraquinone, benzanthraquinone, benzophenone or 4,4′-bis-(dimethylamino)-benzophenone. They can be used alone or as a mixture with one another or in combination with coinitiators, for example ethyl anthraquinone with 4,4′-bis-(dimethylamino)-benzophenone, benzoin methyl ether with triphenylphosphine, diacylphosphine oxides with tertiary amines, or acyldiarylphosphine oxides with benzil dimethyl acetal. They are used in the mixtures in an amount of from 0.001 to 10, advantageously from 0.1 to 5, in particular from 0.3 to 2, % by weight, based on the mixture, the presence of photopolymerizable monomers being one of the factors determining the amount.

Suitable photopolymerizable monomers are disclosed in, for example, U.S. Pat. Nos. 2,760,863 and 3,060,023. They have a boiling point above 100° C. under atmospheric pressure and a molecular weight of up to 3000, in particular up to 2000. Suitable monomers are the esters of acrylic acid and/or methacrylic acid with monohydric or polyhydric alcohols, e.g. butyl acrylate, butyl methacrylate, 2-ethylhexyl acrylate, lauryl (meth)acrylate, ethylene glycol di(meth)acrylate, butane-1,4-diol di(meth)acrylate, neopentylglycol di(meth)acrylate, 3-methylpentanediol di(meth)acrylate, 2-hydroxypropyl (meth)acrylate, 2-hydroxyethyl (meth)acrylate, hexane-1,6-diol di(meth)acrylate, 1,1,1-trimethylolpropane tri(meth)acrylate, di-, tri- and tetraethylene glycol di(meth)acrylate, tripropylene glycol di(meth)acrylate or pentaerythritol tetra(meth)acrylate, as well as poly-(ethylene oxide) di(meth)acrylate, ω-methylpoly-(ethylene oxide)-α-yl (meth)acrylate, N,N-dimethylaminoethyl acrylate or a reaction product of 1 mole of glycerol, 1 mole of epichlorohydrin and 3 moles of acrylic acid; the vinyl esters of aliphatic monocarboxylic acids, e.g. vinyl oleate; the vinyl ethers of alcohols, e.g. octadecyl vinyl ether and butane-1,4-diol divinyl ether; the diesters of fumaric and maleic acid; and the reaction products of oligomeric polybutadienes possessing terminal OH groups with maleic acid or (meth)acrylic acid, i.e. oligomeric polybutadienes containing activated, photopolymerizable olefinic double bonds. They are used in the mixtures, either alone or as a mixture, in an amount of from 1 to 40, advantageously from 3 to 30, in particular from 5 to 20, % by weight, based on the mixture.

Suitable salt formers are 1. inorganic metal compounds, such as oxides, hydroxides, alkoxides where alkyl is of 1 to 4 carbon atoms and carbonates of the cations of Li, Mg, Ca, Sr, Ba, Al, Ga, In, Ge, Sn, Pb, Sb, Bi, Zn, Cd, Mg, Cn, Sc, Y, La, Ti, Zr, Hf, V, Nb, Ta, Cr, Mo, W, Mn, Re, Fe, Co, Ni, Pd or the lanthanides, 2. organometallic compounds of the structure (VII)

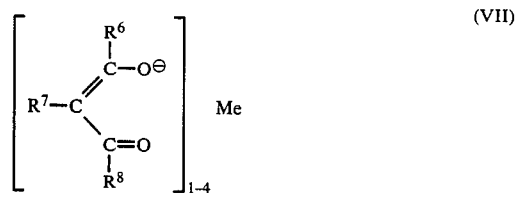

where Me is a cation of one of the abovementioned elements, $R^6$, $R^7$ and $R^8$ are identical or different alkyl, cycloalkyl, aryl or alkylaryl groups, and the radicals $R^6$ and $R^8$ may be cyclically bonded with one another via ring systems, and $R^7$ may furthermore by hydrogen, 3. ammonia, 4. polyfunctional amines, such as ethylenediamine, diethylenetriamine, N-methyl-N-ethylethylenediamine, N,N-dimethylethylenediamine, N,N′-diethylethylenediamine, N,N-N′,N′-tetramethylethylenediamine, N,N,N″,N″-tetramethylethylenetriamine, 1,3-diaminopropane, 1,4-diaminobutane, pyrazine or polyvinylpyridine or 5. hydrazine.

The oxides, hydroxides, alkoxides, carbonates and acetylacetonates of $LI^\oplus$, $Mg^{2\oplus}$, $Ca^{2\oplus}$, $Sr^{2\oplus}$, $Ba^{2\oplus}$, $Al^{3\oplus}$, $Sn^{2\oplus}$, $Sb^{3\oplus}$ and $Zn^{2\oplus}$ are preferred, bis-(acetylacetonato)-Zn(II), MgO and LiOH being particularly preferred.

They are advantageously used in an amount of from 0.05 to 20, preferably from 0.5 to 15, in particular from 1 to 10, % by weight, based on a polymer according to the invention.

Examples of suitable plasticizers are modified and unmodified natural oils and natural resins, such as paraffinic or naphthenic oils, and mineral oil resins or pentaerythritol esters of hydrogenated rosin; esters of alkyl, alkenyl, aralkyl or arylalkenyl alcohols with acids such as citric acid, acetic acid, propionic acid, butyric acid, ethylbutyric acid, ethylhexanoic acid, glycolic acid, benzoic acid, phthalic acid, trimellitic acid, abietic acid, phosphoric acid or stearic acid; synthetic oligomers or resins, such as oligostyrene, oligomeric styrene/butadiene copolymers, oligo-α-methylstyrene, oligomeric-α-methylstyrene/vinyltoluene copolymers, liquid 1,2- or 1,4-oligobutadienes, oligopentadienes, liquid oligomeric acrylonitrile/butadiene copolymers and polyterpene, polyacrylate, polyester and polyurethane resins, synthetic polymers, such as polyethylene or ethylene/propylene/diene rubbers; ω-ethyloligo-(ethylene oxide) and sulfonamides. Amounts of from 1 to 20% by weight, based on a mixture, are advantageous.

Examples of suitable thermal polymerization inhibitors, which are generally added in an amount of from 0.001 to 2% by weight, based on a mixture, and which have no significant self-absorption in the actinic range in which the photoinitiator absorbs, are hydroquinone, p-methoxyphenol, 2,6-di-tert-butyl-p-cresol, β-naphthol, phenothiazine, pyridine, nitrobenzene, m-dinitrobenzene, chloranil, thiazine dyes, such as thionine blue G (C.I. 52,025), methylene blue B (C.I. 52,015) or toluidine blue (C.I. 52,040), and N-nitrosoamines, such as N-nitrosodiphenylamine, and the salts, for example, potassium, calcium or aluminum salts, of N-nitrosocyclohexyl hydroxylamine.

Suitable dyes, pigments or photochromic additives are added to the mixtures in an amount of from 0.0001 to 2% by weight, based on a mixture. They serve to control the exposure properties, for identification, for directly controlling the result of exposure or for esthetic purposes. A precondition for the choice and amount of such additives is that they present as few problems as the thermal polymerization inhibitors in respect of photopolymerization of the mixtures. Examples of suitable substances are the soluble phenazinium, phenoxazinium, acridinium and phenothiazinium dyes, such as neutral red (C.I. 50,040), safranine T (C.I. 50,240), rhodanil blue, the salt and the amide of rhodamine D (Basic Violet 10), rhodanil blue, the salt and amide of rhodamine D (Basic Violet 10, C.I. 45,170), methylene blue B (C.I. 52,015), thionine blue G (C.I. 52,025), thionine blue G (C.I. 52,025) and acridine orange (C.I. 46,005), as well as solvent black 3 (C.I. 26,150). These dyes are also used together with an adequate amount of a reducing agent which does not reduce the dye in the absence of actinic light but is capable of reducing the dye in the excited electronic state on exposure. Examples of such mild reducing agents are ascorbic acid, anethol, thiourea, e.g. diethylallylthiourea, in particular N-allylthiourea, and hydroxylamine derivatives, in particular salts of N-nitrosocyclohexylhydroxylamine, preferably the potassium, calcium and aluminum salts. As stated above, the latter can also serve as thermal polymerization inhibitors. The reducing agents are added in general in amounts from 0.005 to 5% by weight, based on a mixture, the addition of from 3 to 10 times the amount of a concomitantly used dye having proven useful in many cases.

Suitable agents for improving the relief structure of the printing forms produced from the mixtures are, for example, 9,9'-dianthronyl and 10,10'-bisanthrone according to German Laid-Open Application DOS No. 2,720,560.

The mixtures may furthermore contain crosslinking agents such as the trifunctional and tetrafunctional mercapto compounds described in U.S. Pat. Nos. 4,179,531 and 4,234,676.

To protect the mixtures from degradation by oxidation and thermal oxidation by atmospheric oxygen, effective amounts of suitable antioxidants may be added to them, for example sterically hindered monophenols, such as 2,6-di-tert-butyl-p-cresol, alkylated thiobis- and alkylidene bisphenols, such as 2,2'-methylenebis-(4-methyl-6-tert-butylphenol) or 2,2'-bis-(1-hydroxy-4-methyl-6-tert-butylphenyl) sulfide, hydroxybenzyls, such as 1,3,5-trimethyl-2,4,6-tris-(3,5-di-tert-butyl-4-hydroxybenzyl)-benzene, triazines, such as 2-(4-hydroxy-3,5-tert-butylanilino)-b 4,6-bis-(n-octylthio)-1,3,5-triazine, polymerized trimethyldihydroquinone, zinc dibutyldithiocarbamate, dilauryl thiodipropionate or phosphites, such as tri-(nonlphenyl) phosphite. Amounts of from 0.001 to 5% by weight, based on a mixture, are advantageous.

Suitable nonmiscible polymeric or nonpolymeric organic and inorganic fillers or reinforcing fillers are those which are essentially transparent to the wavelengths of the light used for exposing the mixtures according to the invention, do not scatter this light and are substantially matched up with the appropriate mixture in terms of their refractive index, for example polystyrene, organophilic silica, bentonite, silica, organophilic alumina, glass powder, colloidal carbon and various types of dyes and pigments. These additives are used in amounts which vary with the desired properties of the materials according to the invention. The fillers have the advantage that they improve the strength of the mixtures according to the invention, help to reduce the tack and, in certain cases, act as color-imparting agents.

The mixtures may furthermore contain effective amounts of suitable fluxes, such as calcium stearate, and/or mold release agents, such as talc.

In order to use the mixtures as photopolymerizable adhesives and sealing materials, it is advisable to add tackifying resins, eg. paraffin resins, rosin esters, polyterpenes, coumarone/indene resins or compounds according to U.S. Pat. No. 4,133,731.

The amount of additives, which may be used, should in general not exceed 50, in particular 40, % by weight, based on a mixture.

The methods employed for preparing the mixtures from the components have no special features; the conventional kneading, mixing and dissolving techniques may be used.

The mixtures thus obtained can be used directly as photocrosslinkable adhesives and sealing materials or may be further processed to photocrosslinkable films and to plates, in particular printing plates, relief plates and photoresists. For this purpose, they are formed into sheet-like structures of the desired thickness, in a conventional manner by casting from a solution, hot-pressing, calendering or extrusion. In the case of the forms, the thickness depends primarily on the intended use of the sheet-like structures and varies in general from 0.001 to 7 mm, in particular from 0.025 to 6.5 mm, since, for example, printing forms of this thickness which are produced from the said sheet-like structures are suitable for the majority of printing techniques. Films may be of any thickness.

The sheet-like structures can be processed as such to printing forms, relief forms and photocrosslinkable photoresists; however, it is usual first to laminate them with other layer-like materials and then to carry out further processing. Such a laminate is generally referred to as a multilayer element, and the sheet-like structure present therein is referred to as the relief-forming layer (RL).

Usually, such a multilayer element contains a relief-formng layer (RL) which is adhesively bonded to a dimensionally stable base (B). The said base (B) can in turn possess, underneath, a resilient and flexible underlayer (U) according to German Laid-Open Application DOS No. 2,444,118. Furthermore, a covering layer (CL) and/or a cover sheet (CS) can be applied on that side of the layer (RL) which faces away from the base (B). If the covering layer (CL) and cover sheet (CS) are used together, (CL) is directly on top of the layer (RL), and an antiadhesion layer (AL) may be located between (CL) and (CS). Furthermore, a firm adhesive bond can be established between (B) and (RL) and, if required, between (RL) and (CS) with the aid of an adhesion-promoting layer (AP).

Suitable dimensionally stable bases (B) are sheets, films or sleeves of metals, such as steel, aluminum, copper or nickel, or of plastics, such as polyethylene terephthalate, polybutylene terephthalate, nylon or a polycarbonate. Woven fabrics and mats, eg. glass fiber fabrics, or laminated materials made of, for example, glass fibers and plastics such as polyethylene terephthalate are also suitable.

About 0.5–40 μm thick adhesion-promoting layers according to German Laid-Open Applications DOS No. 3,100,175 or DOS No. 3,107,741 are advantageously used as adhesion-promoting layers (AP).

Suitable covering layers (CL) are in general from 0.5 to 20 μm thick and may consist of a polymer which forms soluble, non-tacky, transparent films having a high tensile strength, eg. nylon, nylon copolymers, polyurethane, polyvinyl alcohol, polyvinylpyrrolidone, polyethylene oxide having a molecular weight greater than 105 or cyclized rubber having a high degree of cyclization. If desired, (CL) may be matted.

Suitable cover sheets (CS) are in general from 20 to 150 μm thick and consist of, for example, a polymer such as nylon or polyethylene terephthalate.

Suitable antiadhesion layers (AL) are in general from 0.1 to 0.5 μm thick and consist of, for example, silicone resins according to European Pat. No. 68,599.

If highly reflective sheets or films are used as the base (B), they may contain suitable antihalation agents, such as carbon black or manganese dioxide. However, the antihalation agents may be applied as a separate layer on (B) or may be present in the adhesion-promoting layer (AP) or in the relief-forming layer (RL).

The method for the preparation of such multilayer elements has no special features, and the said elements may be prepared by applying the relief-forming layer (RL) onto the base (B) by casting from solution, hot-pressing, calendering or extrusion. The other layers can then be applied to this two-layer element in a conventional manner. However, it is also possible first to apply the layer (RL) to that side of a cover sheet (CS) which is covered with a covering layer (CL) and then to bond the uncovered side of layer (RL) adhesively to the base (B).

Photocrosslinked printing forms, relief forms, photoresists and films can be produced from the sheet-like structures which consist of the mixtures, or from the multilayer elements which contain relief-forming layers (RL) composed of such mixtures. This conversion of printing plates, relief plates, photoresists or films which can be crosslinked by photopolymerization into printing forms, relief forms, photoresists or films which are crosslinked by photopolymerization does not have any special features in terms of the method.

This conversion is carried out, if necessary after a pretreatment, by imagewise exposure of the printing plates, relief plates and photoresists to actinic light having a wavelength of from 230 to 450 nm, advantageously from 300 to 450 nm, through photographic negatives placed on top, washing out of the unexposed and therefore uncrosslinked parts of the printing plates, relief plates and photoresists with the aid of a suitable developer, drying the resulting forms which consist of a relief layer (RL') or contain the latter, and, if necessary, after-treating the forms. In the case of the films, uniform exposure is carried out. For photocrosslinked films which are produced by uniform exposure to actinic light, the further process steps are of course dispensed with.

Examples of suitable sources of actinic light are commercial UV fluorescent tubes, medium pressure, high pressure and low pressure mercury lamps, superactinic fluorescent tubes, pulsed xenon lamps, metal iodide-doped lamps and carbon arc lamps.

Suitable developers are aromatic hydrocarbons, eg. toluene or ethylbenzene, chloralkanes, eg. 1,1,1-trichloroethane, 1,1,2,2-tetrachloroethane or tetrachloroethylene, ketones, eg. methyl isobutyl ketone, mixtures of such solvents with one another or with lower alcohols, eg. n-butanol, and water and aqueous bases.

The thickness of the relief layer (RL') of the forms varies from 0.001 to 7 mm, depending of the intended use; thicknesses of from 0.025 to 6.5 mm are advantageous.

The printing forms obtained in this manner can be mounted on printing cylinders, if necessary roughened by corona discharge, and used for printing continuous stationery.

The mixtures have a large number of advantages in terms of their preparation and processing. For example, they can be processed very readily by a conventional method and in particular their good meterability in the form of crumbs facilitates charging of extruders, with the result that release agents can generally be dispensed with. The processed materials and forms are clear and transparent, which in particular permits the production of photocrosslinked printing forms, relief forms and photoresists having relief layers (RL') of very great relief depth and good side wall structure. This is absolutely essential, for example, for printing rough, wavy surfaces, for example corrugated cardboard, packaging or napkins. Relief heights of more than 3 mm can therefore be produced without problems, as in the case of conventionally embossed rubber plates, without the layers being closed at deeper levels by polymerization. Not least, the clarity of the mixtures permits short exposure times, without resulting in an unacceptable polymerization gradient in the relief layers (RL'). The exposed materials and forms are stable to external chemical and physical influences and are non-tacky. In particular, the printing forms are very resistant to printing ink solvents and possess high abrasion resistance, permitting very long print runs. The main advantage of the photopolymerized materials and forms based on the polymers according to the invention is their crack resistance.

In addition to the uses stated above, the polymers according to the invention can also be used for the production of hot melt adhesives, adhesion promoters, anti-drumming compounds, insulating materials against mechanical shocks, and surface coatings. They are useful as additives for thermoplastics, synthetic rubbers or asphalt.

EXAMPLES

In the Examples which follow, acid number is the amount of 100% strength KOH in mg which is required to neutralize the free acid functions present in 1 g of product. The Shore A hardness was determined according to DIN 53,505. The swelling of the samples in % by weight was determined after treatment with a solvent mixture consisting of ethanol (7 parts by weight) and ethyl acetate (3 parts by weight). The tendency to crack formation was determined in an ozone chamber at an ozone concentration of 60 pphm and at 25° C. on 10 cm long samples subjected to 10% longitudinal elongation; the criterion in this case was whether cracks occurred in the course of 10 hours. The melt flow index (MFI) was determined at 190° C. under an applied force of 2.16 kp, or at 160° C. under an applied force of 325 p.

Preparation of copolymers A

For the Examples according to the invention, a number of copolymers A were prepared according to German Pat. No. 2,341,462, U.S. Pat. No. 3,264,272 or German Patent Application P No. 35 39 469.2. The composition of the copolymers A are shown in Table 1, and important properties of these copolymers which are relevant with regard to their use are shown in Table 2.

TABLE 1

| Copolymer/ monomer | Copolymer A Content of copolymerized monomers (%) | | | | | | | |
|---|---|---|---|---|---|---|---|---|
| | $A_1$ | $A_2$ | $A_3$ | $A_4$ | $A_5$ | $A_6$ | $A_7$ | $A_8$ |
| Ethylene | 57.1 | 56.4 | 54.9 | 57.4 | 52 | 62.3 | 51.6 | 56.6 |
| Acrylic acid | 18.9 | 18.6 | 21.1 | 17.6 | 17 | 13.7 | 14.4 | 14.9 |
| n-Butyl-acrylate | 24 | 25 | 24 | — | 19 | | | |
| ω-Methyl-poly-(ethylene oxide)-α-yl acrylate | — | — | — | 25 | 12 | 9 | 24 | 11 |
| 2-Ethylhexyl acrylate | — | — | — | — | — | 15 | 10 | 17.5 |

TABLE 2

| Copolymer/ property | Properties of copolymers A | | | | | | | |
|---|---|---|---|---|---|---|---|---|
| | $A_1$ | $A_2$ | $A_3$ | $A_4$ | $A_5$ | $A_6$ | $A_7$ | $A_8$ |
| MFI* | $48^1$ | $7.5^1$ | $17^1$ | $18^2$ | $15^2$ | $26^2$ | $28^2$ | $26^2$ |
| Shore A hardness | 40 | 42 | 32 | 34 | 22 | 29 | 33 | 29 |

*MFI = melt flow index
$^1$ = 190° C./2.16 kp;
$^2$ = 160° C./325 p.

Preparation of maleated and subsequently partially esterified polybutadiene (molecular weight 1300, containing 90% of 1,2-structural units)

For comparison purposes, a maleated polybutadiene was prepared and was partially esterified with 2-hydroxyethyl methacrylate in a further stage. Maleation of liquid polybutadiene 2500 g of the polybutadiene, 500 g of maleic anhydride, 100 g of xylene and 25 g of hydroquinone as an inhibitor were initially taken in a 4 l three-necked flask equipped with a mechanical stirrer, a reflux condenser, a thermometer and a connection for flushing with nitrogen. Thereafter, the reaction flask was flushed for 5 minutes with nitrogen and the content was heated to 190° C. under a nitrogen atmosphere, while stirring constantly. After 6 hours, the reaction was substantially complete, the conversions, based on maleic anhydride used, were higher than 90 mol %. To determine the conversion, a small sample was precipitated in ethanol, reprecipitated twice from toluene with ethanol and hydrolysed, after which its acid number was determined. The resulting degree of maleation was 15% by weight, based on the polybutadiene. Partial esterification of the maleated polybutadiene 654 g of the maleated polybutadiene, 1 l of toluene (dried over a molecular sieve), 3 g of p-dimethylaminopyridine, 3 g of N-nitrosodiphenylamine and 196 g of 2-hydroxyethyl methacrylate were mixed at room temperature in a 2 l three-necked flask equipped with a stirrer, a reflux condenser, a thermometer and dripping funnel, and then stirred for from 3 to 5 hours at from 50° to 90° C. After this time, the IR absorption band at 1780 cm$^{-1}$, which is characteristic of the maleic anhydride/polybutadiene adduct, had vanished. The product was characterized by its acid number. This showed that more than 90 mol % of the succinic anhydride groups originally present had been converted. The amount of 2-hydroxyethyl methacrylate taken up corresponded to 15% by weight, based on the starting polymer. The product was a clear, highly viscous, very tacky liquid.

COMPARATIVE EXPERIMENT 86.7 g of the maleated and partially esterified polybutadiene, 10 g of tripropylene glycol diacrylate, 3 g of benzil dimethyl acetal and 0.3 g of 2,6-di-tert-butyl-p-cresol were dissolved in toluene, the solids content was brought to 40%, based on the total amount of solution, with toluene. The solution was cast on a 125 μm thick polyester film, and the solvent was removed. The unexposed, photopolymerizable or photocrosslinkable relief-forming layer was liquid, highly viscous and very tacky. After the liquid plate, covered with a 10 μm thick polyester film, had been exposed through a photographic negative and washed out with an aqueous ammoniacal solution, plates which had a slightly tacky surface part high resolution were obtained. The developed layers had a deformation distance of 138 μm per 1000 μm of layer thickness under an applied pressure of 100 kp per 0.6 cm$^2$. On prolonged storage, embrittlement occurred and cracks were observed.

Preparation of the polymers according to the invention

EXAMPLE 1

693 g of the copolymer $A_1$, 423 mg of p-dimethylaminopyridine and 423 mg of 2,6-di-tert-butyl-p-cresol were dissolved in 2.2 l of dry tetrahydrofuran at from 40° to 50° C. 42.3 g of glycidyl methacrylate were added dropwise to this solution in the course of 30 minutes. The resulting solution was stirred for 5 hours at 50° C. The solvent was removed to give a transparent, flexible and resilient polymer having an acid number of 117. The content of free glycidyl methacrylate was less than 0.3% by weight, based on the product.

EXAMPLE 2

500 g of the copolymer $A_3$ in the presence of 305 mg of N-methylimidazole and 305 mg of N-nitrosodiphenylamine in a mixture of toluene/methyl ethyl ketone (volume ratio 4:1) were reacted with 30.5 g of glycidyl methacrylate, as described in Example 1. Removal of the solvent gave a transparent, flexible and resilient polymer having an acid number of 115 and containing less than 0.3%, based on the product, of free glycidyl methacrylate.

EXAMPLE 3

20 g of copolymer $A_4$ were kneaded thoroughly together with 0.2 g of 2,6-di-tert-butyl-p-cresol, 25 mg of p-dimethylaminopyridine, 25 mg of N-nitrosodiphenylamine and 4.88 g of glycidyl methacrylate for 30 minutes at 125° C. in a kneader. A transparent polymer containing 1.1%, based on the product, of free glycidyl methacrylate was obtained.

EXAMPLE 4

20 g of the copolymer $A_2$ were kneaded thoroughly together with 0.2 g of 2,6-di-tert-butyl-p-cresol and 1.22 g of glycidyl methacrylate for 30 minutes at 125° C. A transparent polymer having an acid number of 118 was obtained. The sample was then heated at 80° C. for 23 hours without the acid number changing.

EXAMPLE 5

1420 g of copolymer $A_8$ were melted together with 100 g of p-dimethylaminopyridine at 160° C. in a twin-screw extruder. 580 g of glycidyl methacrylate which contained 0.6% of 2,6-di-tert-butyl-p-cresol were metered into the melt by means of a pump. After a residence time of 5 minutes, the material was extruded through a slot die. A transparent, flexible and resilient polymer containing 0.18%, based on the product, of free glycidyl methacrylate was obtained.

EXAMPLE 6

250 g of copolymer $A_5$ according to Table 1, 0.6 g of p-dimethylaminopyridine and 1.5 g of 2,6-di-tert-butyl-p-cresol were dissolved together in 730 ml of tetrahydrofuran. 30.5 g of glycidyl methacrylate were added dropwise to this solution in the course of 30 minutes. The solution was then stirred for 10 hours at 60° C. and the solvent was stripped off. A transparent, flexible and resilient polymer containing less than 1%, based on the product, of free glycidyl methacrylate was obtained.

EXAMPLE 7

200 g of the copolymer $A_4$ according to Table 1 was reacted with 61 g of glycidyl methacrylate in the presence of 1.2 g of p-dimethylaminopyridine and 3 g of 2,6-di-tert-butyl-p-cresol according to Example 1 to give a transparent, flexible and resilient polymer containing less than 1%, based on the product, of free glycidyl methacrylate.

Experiments on the use of the polymers according to the invention for the production of printing plates and printing forms

Use Example 1

A mixture was prepared by extruding, in a twin-screw extruder, 7820 g of copolymer $A_1$ according to Table 1, containing 2.6% of 2,6-di-tert-butyl-p-cresol and 0.061% of p-dimethylaminopyridine, 500 g of trimethylolpropane diacrylate, 1000 g of ω-methylpoly-(ethylene oxide)-α-yl acrylate and 200 g of benzil dimethyl acetal, the percentages being based on $A_1$.

For this purpose, the stabilized copolymer $A_1$ was introduced uniformly into the extruder via a transport screw and melted at 160° C. The other components were metered into the melt by means of pumps, and the mixture was extruded through a slot die onto a 125 μm thick polyester film in such a way that a 2800 μm thick layer resulted. This layer was exposed for 20 minutes through a photographic negative and developed at 50° C. with 0.5% strength aqueous sodium hydroxide solution which contained 0.001% of a sodium paraffinsulfonate as a surfactant. After drying, a plate having a non-tacky surface and a Shore A hardness of 65 to 67 was obtained. Swelling in aqueous printing inks typically used for flexographic printing was less than 2%.

No embrittlement was exhibited even after prolonged storage of the relief layer. No cracks were observed.

Use Example 2

20 g of copolymer $A_1$ according to Table 1, 0.2 g of 2,6-di-tert-butyl-p-cresol, 2.44 g of glycidyl methacrylate and 25 mg of p-dimethylaminopyridine were mixed by kneading for 30 minutes at 120° C. in a plastograph. To do this, 0.83 g of hexane-1,6-diol diacrylate, 0.43 g of hexane-1,6-diol dimethacrylate, 1.25 g of tetraethylene glycol monomethyl ether and 0.7 g of benzil dimethyl acetal were added in succession, and kneading was continued for a further 10 minutes at 120° C. Cooling gave a transparent mixture, which was pressed between a steel underlay and a polyester film in a hot press at 120° C. to give a 1200 μm thick layer. The layer was then exposed through a photographic negative, the polyester film was removed and the layer was washed out with 0.5% strength aqueous sodium hydroxide solution at 40° C. in a brush washer. After drying, a relief layer having a washout depth of 650 μm and a Shore A hardness of 80 was obtained. The relief layer showed no embrittlement even on prolonged storage. No cracks were observed.

Use Example 3

20 g of copolymer $A_1$ according to Table 1, 0.2 g of 2,6-di-tert-butyl-p-cresol, 1.22 g of glycidyl methacrylate and 25 mg of p-dimethylaminopyridine were mixed thoroughly by kneading for 30 minutes at 120° C. in a plastograph, 0.7 g of benzil dimethyl acetal were added and kneading was continued for a further 10 minutes at 120° C. The mixture was pressed to give a 1300 μm thick plate as described in Use Example 2, and the plate was exposed through a photographic negative. After development of the layer in a 0.5% strength aqueous sodium hydroxide solution at 40° C., a plate having a washout depth of 600 μm and a Shore A hardness of 63 was obtained. The resistance to swelling in water-based inks typically used for flexographic printing was excellent. The plate was not brittle even after prolonged storage. No cracks were observed.

Use Example 4

A mixture was prepared, as described in Use Example 2, from 75 g of copolymer $A_2$ according to Table 1, 7 g of glycidyl methacrylate, 10 g of poly-(ethylene oxide) dimethacrylate, 5 g of ω-methylpoly-(ethylene oxide)-α-yl acrylate, 2.8 g of benzil dimethyl acetal, 0.18 g of N-nitrosodiphenylamine and 0.02 g of p-dimethylaminopyridine.

The plates produced from this mixture as described in Use Example 2 had a relief height of 700 μm and a Shore A hardness of 61. They did not exhibit any embrittlement after prolonged storage. No cracks were observed.

Use Example 5

75 g of copolymer $A_3$ according to Table 1, 7 g of glycidyl methacrylate, 15 g of a reaction product of 1 mole of glycerol, 3 moles of epichlorohydrin and 3 moles of acrylic acid and 3 g of benzil dimethyl acetal were mixed thoroughly by kneading for 30 minutes at 120° C. in a plastograph.

The mixture thus obtained was pressed to give a 1300 μm thick layer, as described in Use Example 2. The surface of the unexposed layer was coated with a 3 μm thick layer of polyvinyl alcohol. The layer was then exposed through a photographic negative and then developed for 15 minutes in 0.5% strength aqueous ammoniacal solution. A plate having a relief depth of 700 μm and a Shore A hardness of 70 was obtained. Even after prolonged storage the plate showed no embrittlement. No cracks were observed.

Use Example 6

250 g of copolymer $A_4$ according to Table 1, 600 mg of p-dimethylaminopyridine and 1.5 g of 2,6-di-tert-butyl-p-cresol were dissolved in 750 ml of tetrahydrofuran. 61 g of glycidyl methacrylate were added dropwise in the course of 30 minutes. The reaction mixture was then stirred for 10 hours at 60° C. 35.6 g of tetraethylene glycol diacrylate, 3.6 g of benzil dimethyl acetal, 1.4 g of the calcium salt of N-nitrosocyclohexylhydroxylamine, 0.11 g of safrinine T (C.I. 50,240) and 1.5 g of 2,6-di-tert-butyl-p-cresol were added in succession to the resulting solution. The solution was evaporated down to a solids content of 60%, and cast onto a 125 μm polyester film at 60° C. in such a way that the resulting layer was 650 μm thick when dry. The plates produced as described in Use Example 2 had a Shore A hardness of 67. Even after prolonged storage, the plates were not brittle but retained their excellent flexibility.

Use Example 7

250 g of copolymer $A_6$ according to Table 1 were reacted with 61 g of glycidyl methacrylate as described in Use Example 6, and processed with additives to give a mixture. The plates produced from this mixture as described in Use Example 2 had a Shore A hardness of 73, excellent flexibility, and swelling of less than 5%, based on weight, in water-based inks typically used in flexographic printing.

Use Example 8

250 g of copolymer $A_7$ according to Table 1 were reacted with 30.5 g of glycidyl methacrylate in the presence of 0.3 g of p-dimethylaminopyridine and 1.4 g of 2,6-di-tert-butyl-p-cresol, as described in Use Example 6. 1.8 g of 2,6-di-tert-butyl-p-cresol, 0.11 g of safranine T (C.I. 50,240), 1.45 g of the calcium salt of N-nitrosocyclohexylhydroxylamine, 3.6 g of benzil dimethyl acetal and 36.2 g of ω-methylpoly-(ethylene oxide)-α-yl acrylate were added in succession to the resulting solution. The solution was evaporated down to a solids content of 60% and cast on a 125 μm thick polyester film at 60° C. in such a way that the resulting layer was 500 μm thick when dry. The plates produced as described in Use Example 2 had a Shore A hardness of 60 and a swelling of less than 5%, based on weight, in water-based inks typically used in flexographic printing.

Use Example 9

Copolymer $A_8$ according to Table 1 was reacted with glycidyl methacrylate as described in Use Example 8, and processed to a mixture with additives, the same amount of 2,4,6-trimethylbenzyldiphenylphosphine oxide being used, instead of benzil dimethyl ketal, as a photoinitiator. The plates produced from this mixture as described in Use Example 8 had a Shore A hardness of 52 and excellent image resolution.

Use Example 10

250 g of copolymer $A_1$ according to Table 1 were reacted with 30.5 g of glycidyl methacrylate in the presence of 0.3 g of p-dimethylaminopyridine and 1.4 g of 2,6-di-tert-butyl-p-cresol as described in Use Example 6. 1.52 g of tetraethylene glycol diacrylate, 1.52 g of 2,4,6-trimethylbenzoyldiphenylphosphine oxide, 0.76 g of 2,6-di-tert-butyl-p-cresol, 1.21 g of the calcium salt of N-nitrosocyclohexylhydroxylamine and 0.09 g of safranine T (C.I. 50,240) were added in succession to the solution at 60° C. The solution was evaporated down to a solids content of 63% by weight and cast, at 60° C., on a 125 μm polyester film covered with polyvinyl alcohol, in such a way that the resulting layer was 1050 μm thick when dry. The plates produced therefrom as described in Use Example 2 had a Shore A hardness of 49 and a swelling of less than 3%, based on weight, in water-based inks typically used in flexographic printing. The exposure times of the photosensitive layers could be varied from 10 to 40 minutes without having any significant adverse effect on the resolution of the image elements.

Use Example 11

A mixture was prepared, as described in Use Example 1, from 8300 g of copolymer $A_8$ according to Table 1, 1000 g of glycidyl methacrylate, stabilized with 1% of 2,6-di-tert-butyl-p-cresol, 500 g of trimethylolpropane triacrylate, 132 g of benzil dimethyl ketal, 25 g of 2,6-tert-butyl-p-cresol, 40 g of the calcium salt of N-nitrosocyclohexylhydroxylamine and 3 g of safranine T (C.I. 50,240) by extrusion in a twin-screw extruder.

The photosensitive layer produced from the mixture was exposed for 25 minutes through a photographic negative and washed out as described in Use Example 1. After drying, a plate having a Shore A hardness of 54 and excellent flexibility was obtained. No embrittlement was exhibited even after prolonged storage of the relief layer. No cracks were observed.

Use Example 12

250 g of copolymer $A_8$ according to Table 1 were reacted with 30.5 g of glycidyl methacrylate in the presence of 0.15 g of p-dimethylaminopyridine and 1 g of 2,6-di-tert-butyl-p-cresol as described in Use Example 6. 15.2 g of N,N-diethylaminoethyl acrylate, 1.52 g of benzil dimethyl acetal, 0.76 g of 2,6-di-tert-butyl-p-cresol, 0.09 g of safranine T (C.I. 50,240) and 1.21 g of the calcium salt of N-nitrosocyclohexylhydroxylamine were added in succession to the resulting solution. The solution was evaporated down to a concentration of 56% by weight and cast at 50° C. on a polyester film in such a way that the resulting layer was 1000 μm thick when dry. The plates produced as described in Use Example 2 had a Shore A hardness of 46 and a swelling of less than 2%, based on weight, in water.

Use Example 13

82 g of the polymer according to Example 6, 5 g of bis-(acetylacetonato)-Zn(II), 6.6 g of hexane-1,6-diol diacrylate, 3.4 g of hexane-1,6-diol dimethacrylate and 3.0 g of benzil dimethyl acetal were dissolved in tetrahydrofuran, and the final concentration of the solution was brought to 15%, based on the total weight of the solution. The solution was cast on a 125 μm thick polyethylene terephthalate film in such a way that the resulting layer was 1500 μm thick when dry. The layer produced in this manner was completely clear and had a non-tacky surface. After lamination with a 10 μm thick polyethylene terephthalate film, the layer was exposed to actinic light for 20 minutes through a photographic negative, the 10 μm thick polyester film was removed and the imagewise exposed layer was developed for 15 minutes in a mixture of tetrachloroethylene/n-butanol (volume ratio 4:1). After drying, a printing form having a relief depth of 800 μm and very good resolution was obtained. The printing form had very high flexibility and a Shore A hardness of 55 and could be clamped repeatedly on small printing cylinders without breaking. It had a long shelf life and showed no embrittlement even after prolonged storage. No cracks were observed.

Use Example 14

A mixture was prepared, as described in Use Example 12, from 87.5 g of the polymer according to Example 6, 0.5 g of bis-(acetylacetonato)-Zn(II), 10 g of tetraethylene glycol diacrylate and 2 g of 2,4,6-trimethylbenzoyldiphenylphosphine oxide. The layer thus obtained was completely clear. After lamination with a 10 μm thick polyethylene terephthalate film, the layer was exposed for 15 minutes through a photographic negative, the 10 μm thick polyester film was removed and the imagewise exposed layer was developed for 20 minutes in 0.5% strength aqueous ammoniacal solution. After drying, a relief form having a relief depth of 900 μm and a Shore A hardness of 48 was obtained. The printing form possessed very high flexibility and gave a long print run. No cracks were observed.

Use Example 15

20 g of polymer $A_8$ according to Table 1, 0.2 g of 2,6-di-tert-butyl-p-cresol, 1.1 g of tetraethylene glycol diacrylate, 0.11 g of 2,4,6-trimethylbenzoyldiphenylphosphine oxide, 0.09 g of the calcium salt of N-nitrosocyclohexylhydroxylamine, 0.2 g of magnesium oxide and 0.01 g of safranine T (C.I. 50,240) were kneaded thoroughly for 30 minutes at 120° C. in a plastograph. Cooling gave a transparent mixture which was applied to a 125 μm polyester film by means of a hot press at 120° C. so that the resulting layer was 1500 μm thick. After application of a 3 μm thick layer of highly hydrolysed polyvinyl alcohol, the layer was exposed for 15 minutes through a photographic negative and developed for 20 minutes at 60° C. with 0.5% strength aqueous sodium hydroxide solution. After drying, a printing form having a relief depth of 800 μm and a Shore A hardness of 60 was obtained. The printing form had excellent flexibility and gave a long print run. No cracks were observed.

Use Example 16

A mixture was prepared, as described in Use Example 12, from 85.02 g of the polymer according to Example 7, 3 g of lithium hydroxide, 10 g of 1,1,1-trimethylpropane triacrylate, 1.3 g of benzil dimethyl acetal, 0.25 g of 2,6-di-tert-butyl-p-cresol, 0.4 g of the calcium salt of N-nitrosocyclohexylhydroxylamine and 0.03 g of safranine T (C.I. 50,240). The layer thus obtained was exposed for 20 minutes through a negative and then developed for 20 minutes in a 0.5% strength aqueous sodium hydroxide solution which contained 1% ammonia. After drying, a relief form having a relief depth of 600 μm was obtained. The printing form had a Shore A hardness of 82 and good flexibility and did not exhibit any embrittlement even after prolonged storage. No cracks were observed.

We claim:

1. A polymer modified by a polymer-analogous reaction in the acid form or in the form of its salts, which consists essentially of
   (A) a copolymer of
      ($a_1$) from 30 to 70 parts by weight of ethylene,
      ($a_2$) from 5 to 40 parts by weight of acrylic acid or methacrylic acid or a mixture of these, and
      ($a_3$) from 5 to 50 parts by weight of one or more compounds selected from the group consisting of vinyl esters, vinyl ethers, acrylates, methacrylates, acrylamides and methacrylamides, and
   (B) side radicals of the formula I,

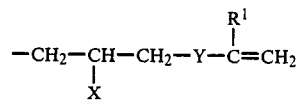

where X is hydroxyl, amino or mercapto, Y is an ester, amide, ether or $C_1$–$C_{10}$-alkylene group and $R^1$ is hydrogen or methyl, which side radicals B have been introduced into the said copolymer A by the reaction of one or more of the carboxyl groups of the said copolymer A with an oxiran-2-yl, thiiran-2-yl or aziridin-2-yl compound to yield ester groups containing the said side radicals B.

2. A polymer modified by a polymer-analogous reaction in the acid form or in the form of its salts, which consists of
   (A) a copolymer of
      ($a_1$) from 30 to 70 parts by weight of ethylene,
      ($a_2$) from 5 to 40 parts by weight of acrylic acid or methacrylic acid or a mixture of these, and
      ($a_3$) from 5 to 50 parts by weight of one or more compounds selected from the group consisting of vinyl esters, vinyl ethers, acrylates, methacrylates, acrylamides and methacrylamides,
   (B) side radicals of the formula I

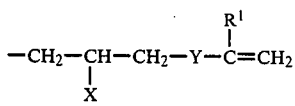

where X is hydroxyl, amino or mercapto, Y is an ester, amide, ether or $C_1$–$C_{10}$-alkylene group and $R^1$ is hydrogen or methyl, which side radicals 13 have been introduced into the said copolymer A by the reaction of one or more of the carboxyl groups of the said copolymer A with a suitable oxiran-2-yl, thiiran-2-yl or aziridin-2-yl compound to yield ester groups containing the said side radicals B, and
   (C) side radicals of the formula II

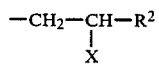

where $R^2$ is a polar group, hydrogen or a further group X and x is hydroxyl, amino or mercapto, which side radicals C have been introduced into the said copolymer A by the reaction of one or more of the carboxyl groups of the said copolymer A with a suitable oxiran-2-yl, thiiran-2-yl or aziridin-2-yl compound to yield ester groups containing the said side radicals C.

3. A polymer as set forth in claim 1, wherein copolymer A consists of
   ($a_1$) from 40 to 60 parts by weight of ethylene,
   ($a_2$) from 8 to 30 parts by weight of acrylic acid or methacrylic acid or of a mixture of these, and
   ($a_3$) from 20 to 40 parts by weight of one or more compounds selected from the group consisting of vinyl esters, vinyl ethers, acrylates, methacrylates, acrylamides and methacrylamides.

4. A polymer as set forth in claim 1, which is present in the form of its metal, ammonium or hydrazinium salts or as salts of polyfunctional amines.

5. A polymer as set forth in claim 1, wherein component $a_3$ is vinyl acetate.

6. A polymer as set forth in claim 1, wherein component $a_3$ is vinyl but-1-yl ether.

7. A polymer as set forth in claim 1, wherein component $a_3$ is n-butyl acrylate, 2-ethylhexyl acrylate, dicyclopentadienyl acrylate and/or ω-methylpoly(ethylene oxide)-α-yl acrylate.

8. A polymer as set forth in claim 2, wherein copolymer A consists of
   ($a_1$) from 40 to 60 parts by weight of ethylene,
   ($a_2$) from 8 to 30 parts by weight of acrylic acid or methacrylic acid or of a mixture of these, and
   ($a_3$) from 20 to 40 parts by weight of one or more compounds selected from the group consisting of vinyl esters, vinyl ethers, acrylates, methacrylates, acrylamides and methacrylamides.

9. A polymer as set forth in claim 2, wherein component $a_3$ is vinyl acetate.

10. A polymer as set forth in claim 2, wherein component $a_3$ is vinyl but-1-yl-ether.

11. A polymer as set forth in claim 2, wherein component $a_3$ is selected from the group consisting of n-butyl acrylate, 2-ethylhexyl acrylate, dicyclopentadienyl acrylate and ω-methylpoly(ethylene oxide)-α-yl acrylate.

12. A polymer as set forth in claim 2, wherein $R^2$ is ω-alkylpoly(ethylene oxide)-α-oxyl.

13. A polymer as set forth in claim 2 which is present in the form of its metal, ammonium or hydrazinium salts or as salts of polyfunctional amines.

14. A polymer as set forth in claim 3, which is present in the form of its metal, ammonium or hydrazinium salts or as salts of polyfunctional amines.

15. A polymer as set forth in claim 6, which is present in the form of its metal, ammonium or hydrazinium salts or as salts of polyfunctional amines.

16. A polymer as set forth in claim 7, which is present in the form of its metal, ammonium or hydrazinium salts or as salts of polyfunctional amines.

17. A polymer as set forth in claim 5, which is present in the form of its metal, ammonium or hydrazinium salts or as salts of polyfunctional amines.

18. A polymer as set forth in claim 8, which is present in the form of its metal, ammonium or hydrazinium salts or as salts of polyfunctional amines.

19. A polymer as set forth in claim 9, which is present in the form of its metal, ammonium or hydrazinium salts or as salts of polyfunctional amines.

20. A polymer as set forth in claim 10, which is present in the form of its metal, ammonium or hydrazinium salts or as salts of polyfunctional amines.

21. A polymer as set forth in claim 11, which is present in the form of its metal, ammonium or hydrazinium salts or as salts of polyfunctional amines.

22. A polymer as set forth in claim 12, which is present in the form of its metal, ammonium or hydrazinium salts or as salts of polyfunctional amines.

* * * * *